United States Patent [19]
Ahlgren et al.

[11] Patent Number: 5,656,514
[45] Date of Patent: Aug. 12, 1997

[54] METHOD FOR MAKING HETEROJUNCTION BIPOLAR TRANSISTOR WITH SELF-ALIGNED RETROGRADE EMITTER PROFILE

[75] Inventors: David Ahlgren, Wappingers Falls; Jack Chu, Long Island City; Martin Revitz, Poughkeepsie; Paul Ronsheim, Wappingers Falls; Mary Saccamango, Patterson; David Sunderland, Hopewell Junction, all of N.Y.

[73] Assignee: International Business Machines Corporation, Armonk, N.Y.

[21] Appl. No.: 346,209

[22] Filed: Nov. 22, 1994

Related U.S. Application Data

[62] Division of Ser. No. 912,945, Jul. 13, 1992, abandoned.
[51] Int. Cl.$^6$ .................... H01L 21/265
[52] U.S. Cl. .................... 438/320; 257/198; 257/197; 438/317; 438/936
[58] Field of Search .................... 437/131, 126, 437/128; 148/DIG. 10, DIG. 59, DIG. 12; 257/197, 198, 183, 565, 578, 583, 591, 592

[56] References Cited

U.S. PATENT DOCUMENTS

| | | | |
|---|---|---|---|
| 4,319,932 | 3/1982 | Jambotkar | 148/1.5 |
| 4,967,254 | 10/1990 | Shimura . | |
| 5,006,912 | 4/1991 | Smith et al. . | |
| 5,063,427 | 11/1991 | Tully et al. . | |
| 5,106,767 | 4/1992 | Comfort et al. | 437/31 |
| 5,323,032 | 6/1994 | Sato et al. | 257/198 |
| 5,346,840 | 9/1994 | Fujioka | 437/31 |
| 5,389,803 | 2/1995 | Mohammad | 257/197 |

OTHER PUBLICATIONS

Theodore Kamins et al, "Small-Geometry . . . Bipolar Transistors", IEEE Electron Device Letters, vol. 10, No. 11, Nov. 1989.

IEDM-89, Dec. 1989, IEDM Tech. Dig., p. 890, "A 45 GHz strained-layer SiGe Heterojunction Bipolar Transistor Fabricated With Low Temperature EPI" by Fischer et al.

"Thermodynamic Analysis of SlxGel-x"; S. Change et al.; Department of Chemical Engineering; University of Florida; Proceedings of the Tenth International Conference on Chemical Vapor Deposition; 1987; pp. 122-131.

"Cooperative growth phenomena in silicon/germanium low-temperature epitaxy"; Bernard S. Meyerson et al.; IBM Research Division; T.J. Watson Rsearch Center; Appl. Phys. Lett. 53 (25); Dec. 19, 1988; pp. 2555-2557.

"75-GHz fr SiGe-Base Heterojunction Bipolar Transistors"; Gary L. Patton et al. 1990 IEEE; pp. 171-173.

"Submicrometer Si and Si-Ge Epitaxial-Base Double-Poly Self-Aligned Bipolar Transistors"; T.C. Chen et al.; IEEE Transactions on Electron Devices; vol. 38, No. 4, Apr. 1991; pp. 941-943.

"High Frequency Si/Si1-x Gex Heterojunction Bipolar Transistors"; T.I. Kamins et al.; 1989 IEEE; IEDM 89; pp. 647-649.

"Heterostructure Bipolar Transistors and Integrated Circuits"; Herbert Kroemer; 1982 IEEE; pp. 13-25.

(List continued on next page.)

Primary Examiner—John Niebling
Assistant Examiner—Long Pham
Attorney, Agent, or Firm—Whitham, Curtis, Whitham & McGinn; Harold Huberfeld

[57] ABSTRACT

A high gain, high frequency transistor is formed having a combination of a moderately doped retrograde emitter and a collector which is formed by self-aligned implantation through an emitter opening window. This combination allows continued base width scaling and ensures high current capability yet limits the electric field at the emitter-base junction, particularly near the base contacts, in order to reduce leakage and capacitance and to enhance breakdown voltage. Cut-off frequencies on the order of 100 GHz can thus be obtained in the performance of a transistor with a 30 nm base width in a SiGe device.

8 Claims, 4 Drawing Sheets

OTHER PUBLICATIONS

"Graded-SiGe-Base, Poly-emitter Heterojunction Bipolar Transistors"; Gary L. Patton; 1989 IEEE; vol. 10, No. 113, Dec. 1989; pp. 534–536.

"Small-Geometry, High-Performance, Si-Si1-xGex Heterojunction Bipolar Transistors"; Theodore I. Kamins et al.; 1989 IEEE; pp. 503–505.

"Self-Aligned SiGe-Base Heterojunction Bipolar Transistor by Selective Epitaxy Emitter Window (SEEW) Technology"; Joachim N. Burghartz et al.; 1990 IEEE; pp. 287–290.

METHOD FOR MAKING HETEROJUNCTION BIPOLAR TRANSISTOR WITH SELF-ALIGNED RETROGRADE EMITTER PROFILE

This application is a divisional of application Ser. No. 07/912,945, filed on Jul. 13, 1992 now abandoned.

BACKGROUND OF THE INVENTION

1. Field of the Invention

The present invention generally relates to the construction and structure of bipolar transistors and, more particularly, to the construction and structure of high performance heterojunction bipolar transistors.

2. Description of the Prior Art

The bipolar transistor continues to be a basic circuit element in integrated circuits due to its high speed switching capability and current carrying capacity. Consequently, many improvements in bipolar transistors have been made in the past to reduce size and the complexity of device formation while increasing performance capability.

One particularly high performance bipolar transistor type is known as a self-aligned base transistor, an example of which is disclosed in U.S. Pat. 4,319,932 (hereby fully incorporated by reference), to Jambotkar which discloses formation of a raised subcollector, intrinsic base and emitter by implantation through an implantation window. Directional ion etching is used to open the implantation window in the polysilicon base while preserving insulating sidewalls on the window edges.

The self-aligned poly base transistor is characterized by the formation of the base and emitter over a sub-collector in an aperture in an insulator formed on a substrate. The extrinsic base is formed, in accordance with that invention, by a first deposition of polysilicon and the intrinsic base formed by doping through a smaller emitter opening through the extrinsic base. After formation of insulating sidewalls, the emitter is formed by an implantation through the same opening. Alternatively, the emitter can be formed by diffusion through the same opening from a second polysilicon deposition, resulting in a transitor known as a self-aligned double polysilicon transistor which can be constructed together with complementary metal-oxide-semiconductor (CMOS) transistors on a single substrate as disclosed in copending U.S. patent application Ser. No. 07/643,907, by Monkowski et al., filed Jan. 18, 1991 now abandoned, and assigned to the assignee of the present invention. This copending U.S. patent application is hereby fully incorporated by reference. Either process can be made to result in a very thin intrinsic base region and a base-emitter junction of very small area, resulting in high performance.

The formation of a heterojunction in bipolar transistors has been widely recognized as a tool by which the performance of transistors may be extended by introducing additional design flexibility. The use of a semiconductor in the emitter with a wider band gap than that of the base enhances the intrinsic gain of the device and allows a reorganization of the potential profile of the device. Grading the bandgap across the base produces a built-in quasi-electric field which accelerates minority carriers and raises the cut-off frequency and switching speed.

Most heterojunction transistors are generally formed using alloys of group III-V semiconductor materials because of their high electron mobility and the availability of advanced crystal growth techniques such as molecular beam epitaxy (MBE) and metal organic chemical vapor deposition (MOCVD). For providing such heterojunction devices in silicon transistors, two approaches have evolved, respectively utilizing wide (i.e. GaP, SiC or amorphous Si grown on the base) and narrow (i.e. a SiGe alloy base sandwiched between a silicon collector and a silicon emitter) band gap materials. This latter type of transistor is often referred to as a silicon/germanium heterojunction bipolar transistor (SiGe HBT).

Likewise, two approaches to the design of SiGe HBT's have evolved. The first involves producing epitaxially grown silicon emitter and base layers, each layer being uniformly doped. The emitter dopant concentration is lower than the concentration of the base, contrary to the practice in conventional (homojunction) bipolar junction transistors (BJT's). This permits the use of a thinner base for a given base resistance and lowers the base-emitter junction capacitance and electric field. Difficulty has been encountered, however, in the growing of lightly doped n-type silicon with a ultra high vacuum chemical vapor deposition process in order to form an NPN transistor. Because these devices have typically used a non-self aligned base contact and mesa isolation, their performance has been limited. A further performance limitation results because the emitter dopant is not segregated from the base contacts, thus requiring a trade-off between current carrying capability and emitter-base leakage and capacitance.

In the second approach, the transistor structure resembles the structure of the self-aligned double polysilicon transistor structure described above with the addition of an epitaxial SiGe layer base. The doping profile, however, resembles that of an ordinary bipolar junction transistor. Diffusion from a polysilicon emitter contact produces a heavily doped emitter region which is self-aligned to the emitter contact opening. Ion implantation through the same opening into the epitaxial base layer can also produce a localized increase in collector doping to allow for optimization of current carrying capability without increasing collector capacitance. Using a graded SiGe base 45 nm wide in this type of structure has yielded a 75 GHz cutoff frequency. However, there is a limit to the extent to which this performance can be further improved because of a practical limitation on the base doping level. The base doping level determines the emitter-base junction field, which in turn causes leakage and high emitter capacitance if not limited. In other words, this design cannot be improved by scaling to meet present performance requirements. Also, because the base is not extremely thin, high mole fractions of germanium and/or other alloying materials cannot be used without degrading material quality since the alloying of Germanium causes the layer to become strained and therefore possibly unstable.

SUMMARY OF THE INVENTION

It is therefore an object of the present invention to provide a transistor structure deriving high gain from an emitter-base heterojunction in combination with a moderately doped emitter for high current capability, yet with low emitter-base leakage and capacitance and high reliability.

It is a further object of the present invention to provide a transistor with high frequency performance which cannot be achieved by scaling of doping profiles beyond the limits imposed by high emitter-base electric fields in conventional transistor designs.

In order to accomplish these and other objects of the invention, a transistor structure is provided including an emitter-base heterojunction and a retrograde emitter formed by the process including the steps of depositing a layer including an emitter-base heterojuncton having a predetermined concentration profile of at least one band gap determining material, depositing impurities in accordance with a predetermined impurity concentration profile, forming an emitter opening in an insulator over the layer including said emitter-base heterojunction, and forming an emitter of the transistor by impurity implantation in the layer including said emitter-base heterojunction and self-aligned with said emitter opening.

In accordance with another aspect of the invention, a transistor including a layer including an emitter-base heterojunction, a retrograde emitter having a transverse dimension approximately the same as that of the contact opening emitter of the transistor and, optionally, a collector having the same dimension.

In accordance with a further aspect of the invention, a method of making a transistor structure including an emitter-base heterojunction and a retrograde emitter is provided including the steps of depositing a layer including an emitter-base heterojunction having a predetermined concentration profile of at least one band gap determining material, depositing impurities in accordance with a predetermined impurity concentration profile, forming an emitter opening in an insulator over the layer including the emitter-base heterojunction, and forming an emitter of said transistor by impurity implantation in the layer including the emitter-base heterojunction and self-aligned with the emitter opening.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
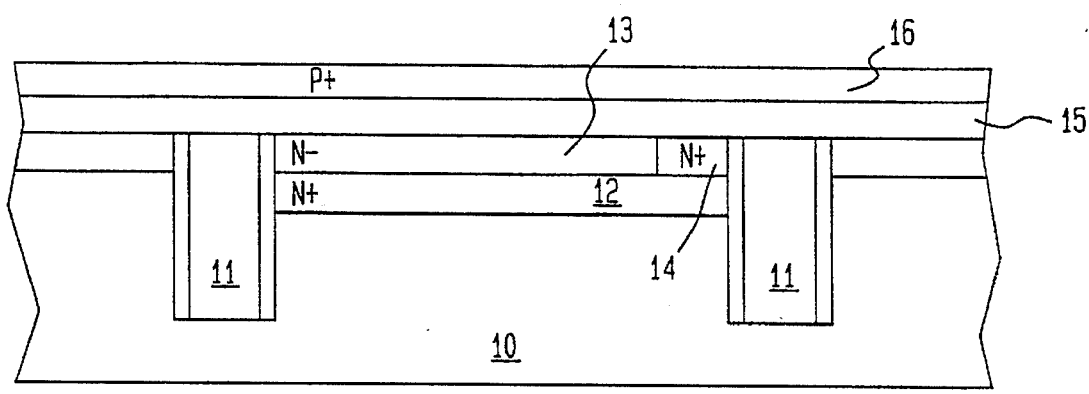
FIGS. 1, 2, 3, 4, 5 and 6 are illustrative of the fabrication of the transistor in accordance with the invention, FIG. 7 graphically illustrates the as-grown dopant and a band-gap determining alloying material (i.e. germanium) concentration profile of the retrograde emitter of a transistor in accordance with a preferred embodiment of the invention, FIG. 8 graphically illustrates the final net dopant concentration profile of a transistor in accordance with a preferred embodiment of the present invention.

Referring now to the drawings, and more particularly to FIG. 1, there is shown a substrate 10 including polysilicon-filled isolation trenches 11 to separate a transistor formed in accordance with the invention from other devices of similar or different design or technologies which may be formed on the same substrate. An N+ subcollector 12 has been implanted to a substantial depth within the substrate below a lightly doped N− region 13. Alternatively, layers 12 and 13 may be sequentially deposited on the surface of substrate 10. An N+ reach through region 14 has also been implanted in the lightly doped region 13. A blanket layer of insulator 15 and a P+ base blanket layer 16 have also been deposited on the surface of the substrate. At this point in the fabrication process, the structure is similar to numerous transistor designs and further detailed explanation is not necessary to the practice of the invention.

Figure 2:
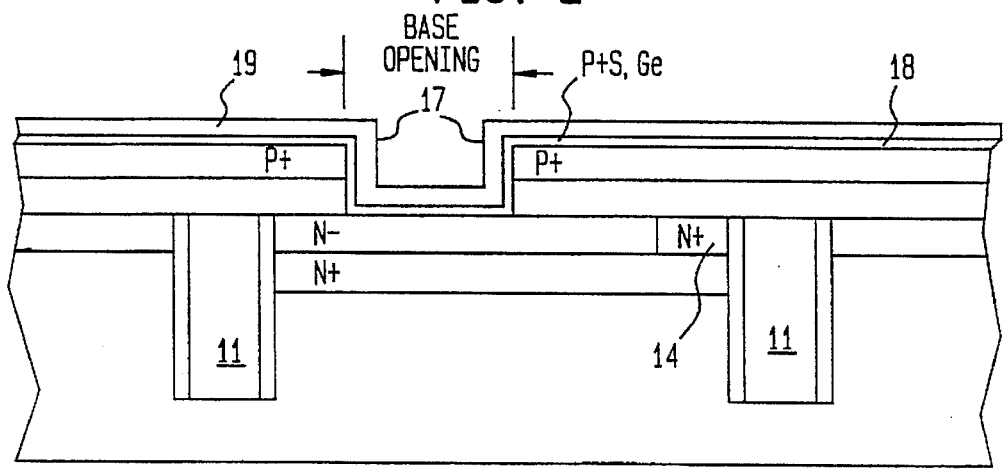
Figure 3:
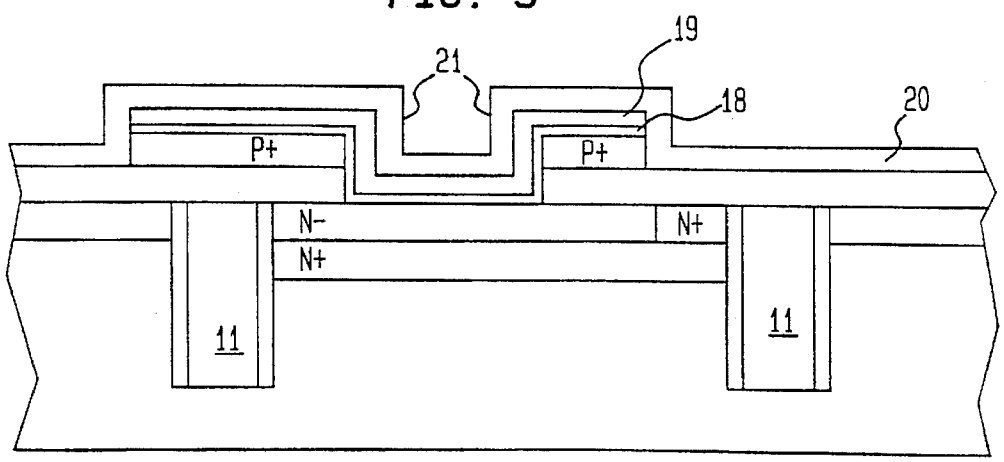

In this regard, it is to be understood that FIGS. 1–6 are intended to show a generic application of the invention to a transistor structure since the invention is applicable to improve performance of transistors of numerous different designs. Accordingly, FIGS. 1–6 and FIG. 4, in particular, are specifically not admitted to be prior art as to the present invention although some of the structure illustrated, particularly in FIGS. 1–3 is similar to known transistor structures. For example, "A 45 GHz Strained-Layer SiGe Heterojunction Bipolar Transistor Fabricated With Low Temperature Epi" by S. E. Fisher et al., IEDM Tech. Dig., p 890, December 1989, discloses a similar transistor structure but uses a heavily doped polysilicon emitter rather than a retrograde emitter structure as in the present invention. U.S. Pat. 4,319,932, to C. G. Jambotkar and assigned to the assignee of the present invention also uses self-aligned implantation at differing energies to form a raised subcollector and intrinsic base.

Other examples of transistor designs to which the invention will be readily applicable in view of the following disclosure but which show different techniques of integrating the extrinsic base with the intrinsic epitaxial base are described in "Graded-SiGe-Base, Poly-Emitter Heterojunction Bipolar Transistors" by G. L. Patton, IEEE Elec. Dev. Lett., EDL-10, p 534, December 1989; 75 GHz $f_T$ SiGe-Base Heterojunction Bipolar Transistors", by G. L. Patton et al., IEEE Elec. Dev. Lett., EDL-11, p 171, April 1990; "Self-Aligned SiGe-Base Heterojunction Bipolar transistor by Selective Epitaxy Emitter Window (SEEW) Technology", by J. N. Bughartz et al., IEEE Elec. Dev. Lett., EDL-11, p 288, April 1990; "Submicrometer Si and SiGe Epitaxial Base Double-Poly Self Aligned Bipolar Transistors", by T. C. Chen et al., IEEE Trans. Elec. Dev., ED-38, p 941, April 1991; "Small-Geometry, High-Performance, $SiSi_{1-x}Ge_x$ Heterojunction Bipolar Transistors", by T. I. Kamins et al., IEEE Elec. Dev. Lett., EDL-10, p 503, November 1989: and "Design and Evaluation of a Planar GaAlAs-GaAs Bipolar transistor" Elec. Lett., Vol. 16, p 41, January 1980, as well as many other structures and designs.

Accordingly, beginning with the generic structure of FIG. 1, a base opening is formed at a location generally between an isolation trench 11 and N+ reach through region 14. Blanket layers of P+ SiGe 18, to form the intrinsic base and undoped silicon 19, to form the emitter are then applied, as shown in FIG. 2. Preferably, the highly doped SiGe base layer 18 is very thin and of a thickness on the order of 30 nm at least within the base opening.

It should be noted that the only patterning step required in FIG. 2 is the formation of the base opening, preferably by an etching process such as reactive Ion Etching (RIE) by the use of a mask. However, the location of the base opening between the isolation trench 11 and the collector reach through region 14 is not particularly critical, depending on the size and integration density of the transistor or other structures on the substrate.

It should also be noted in FIG. 2 that the layer 18 and 19 are preferably formed by a single low-temperature epitaxy (LTE) process with variation of the concentrations of dopant and alloying material and, hence, may be considered as a single layer. The LTE process causes the layer or layers to be single crystal where the material is deposited over single crystal silicon (i.e. within the base window) and polycrystalline when deposited over polycrystal. While this is of no particular importance other than the formation of epitaxial base and emitter layers at low temperatures in the generic transistor structure to which the invention is applied in FIGS. 1–6, it may provide simplification of some transistor structures since polycrystalline silicon and epitaxial silicon may be differentially etched.

Referring now to FIG. 3, the blanket layers 16, 18 and 19 are patterned, preferably by etching to define the extrinsic base regions of the transistor. This base patterning is followed by application of a blanket insulator layer 20 which also forms insulating sidewalls 21 over the undoped emitter layer 19 and intrinsic base layer 18 inside the base opening region 17. Insulating sidewalls 21 may also be formed by other processes, as well, as will be understood by those skilled in the art in view of this disclosure. However, formation from insulating layer 20 is illustrated in the interest of simplicity and clarity. Insulating layer 20 also provides insulation between the emitter, base and collector connections to the transistors where it overlies layers 16, 18 and 19 both inside and outside the base opening region or window 17, as will be more apparent from FIG. 6.

Figure 4:
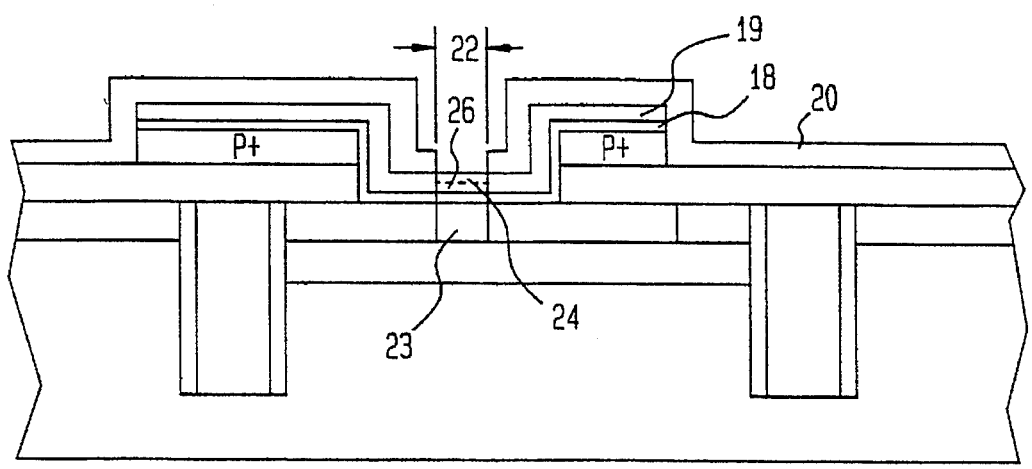

Referring now to FIG. 4, the particular features and construction unique to the present invention will now be described in detail. Initially, an emitter opening window 22 is formed through insulator 20. This is not a self-aligned process but the positioning may or may not be critical, depending on the relative sizes of the emitter window and the space remaining in the base opening window 17 (FIG. 2) after deposition of base and emitter layers 18 and 19 and sidewalls/layer 20. It should be understood that because of the self-aligned implantation processes and the as-deposited or originally doped compositions of layers 18 and 19 and the N− region 13 (referred to as an extrinsic collector region since the dopant level which exist at this point in the fabrication process have not yet formed a functional collector structure), the size of the base window 17 can be made as large as desired without significant effect on performance of the transistor since the extrinsic base region is protected from dopant implantation by the remainder of insulator 20 within the base opening window 17. This limitation of dopant in the extrinsic base region (i.e. outside the emitter opening window 22) reduces the electric field of the extrinsic base-emitter junction, reducing capacitance and leakage and increasing the breakdown voltage of the transistor.

Figure 5:
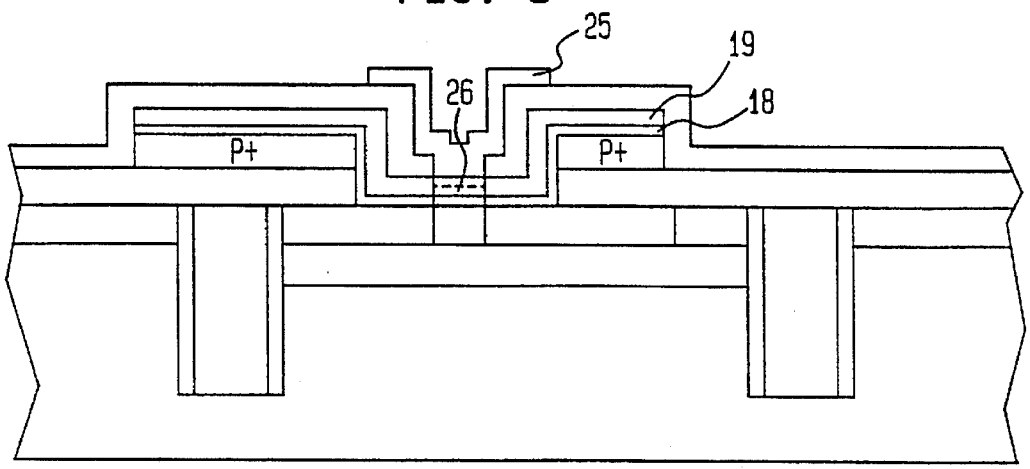

As further shown in FIG. 4, the collector is formed in N-layer 13 by one or more high-energy N-type dopant implantations 23 to collective depths sufficient to reach subcollector 12. As indicated above, the area of the collector is limited since the dopant implantation uses the emitter opening in insulator layer 20 as a mask. The collector implantation is then followed by a shallow, low-energy implant to raise the emitter dopant level sufficiently to support the desired level of current conduction but significantly less than the peak base doping to avoid excessive leakage of the base-emitter junction. It should be noted in this regard that the emitter doping is less than the base doping and thus does not affect the base width (i.e. thickness). The distinction should also be noted between the electric field, which is reduced by the limitation of emitter doping level (hence, the term "retrograde emitter") and the quasi-electric field which is formed by the heterojunction which results in gain to compensate for the retrograde emitter doping. Thus gain of the transistor is preserved and enhanced while avoiding leakage and capacitance which would otherwise be caused. Subsequently, as shown in FIG. 5, a heavily doped polysilicon contact 25 is placed in the emitter opening and further diffusion is caused by annealing. Preferably, the annealing is done by a rapid thermal annealing (RTA) process to limit diffusion of the base layer 18 to the emitter and collector which would widen (i.e. thicken) the base.

The profile of the band gap determining materials should determined with the final dopant profile in mind. For example, the location of the edges of the low bandgap base region, shown by dashed lines in FIG. 7, which do not significantly move during the RTA process, should be properly aligned with respect to the position of the expected doping junctions (i.e. junctions formed due to doping), as shown in FIG. 8 and which do, in fact, move as a result of the anneal. That is, the location of the band gap determining material should generally coincide with the location of the final location Of the dopant. Because the Si/SiGe heterojunction determines the gain of the transistor, a polysilicon emitter contact may be unnecessary as a diffusion source and could be replaced by metal over a heavy but shallow emitter implant. This would eliminate a major and relatively critical process variable and also eliminate any problem with the formation of an oxide at the interface of the epitaxial emitter layer 19 and the polysilicon contact 25. In any event, the vertical diffusion of the emitter contact dopant becomes relatively non-critical since it does not determine the location of the base-emitter junction. The width (i.e. thickness) of the moderately doped emitter region 26 is also non-critical but should be minimized to reduce charge storage at high current levels or, alternatively, just thick enough to support the depletion region at zero bias. For example, the 30 nm thickness of the lightly doped side of the base emitter junction in FIG. 8 is generally sufficient to avoid contact of the depletion region with the heavily doped contact region, which would raise capacitance. As a result of the existence of a moderately doped emitter region 26 in accordance with the invention, the doping levels of the base layer 18 are largely unchanged (i.e. uncompensated). Therefore, the intrinsic base sheet resistivity is easily controlled.

Figure 6:
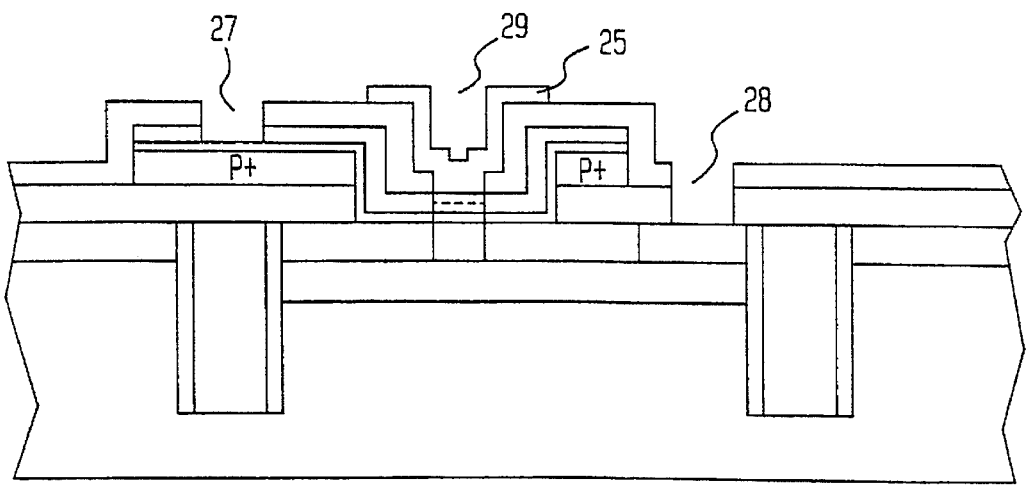

As shown in FIG. 6, the transistor in accordance with the invention is completed by the formation of base and collector contact openings 27 and 28 respectively. Subsequently, metallization together with adhesion layers, if desired, are placed in the contact openings 27, 28 and 29.

As a specific example of a preferred embodiment of the transistor and process for forming the same in accordance with the present invention, reference is now made to FIGS. 7–10. However, it is to be understood that the embodiment shown in FIGS. 9 and 10 correspond closely to the structure illustrated in FIGS. 1–6 but reflect the preferred processing as to the formation of the base and emitter as a single layer 180 including an emitter-base heterojunction, the band gap of which is variable to form the heterojunction and the formation of the collector by plural implantations at differing energies. The following description also provides preferred process operations and values for dopant levels, mole fractions and geometries in the forgoing description of FIGS. 1–6.

As before, the process is assumed to start with a substrate or wafer on which a 0.6 μm layer of lightly doped ($1 \times 10^{16}$/cm$^3$ or less) layer has been formed over a heavily doped (approximately $1 \times 10^{20}$/cm$^3$) subcollector layer and isolation structures such as isolation trenches have been formed therethrough and the subcollector reach through region been formed. The base and emitter blanket layers are grown by ultra-high vacuum chemical vapor deposition (UHV-CVD) to a total thickness of 90 nm.

Figure 7:
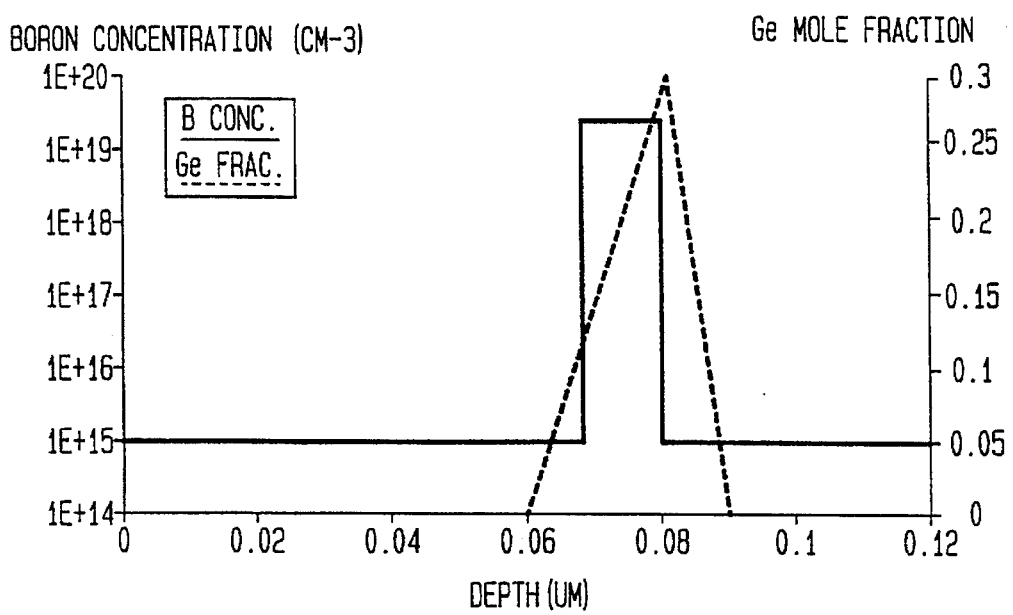
Figure 8:
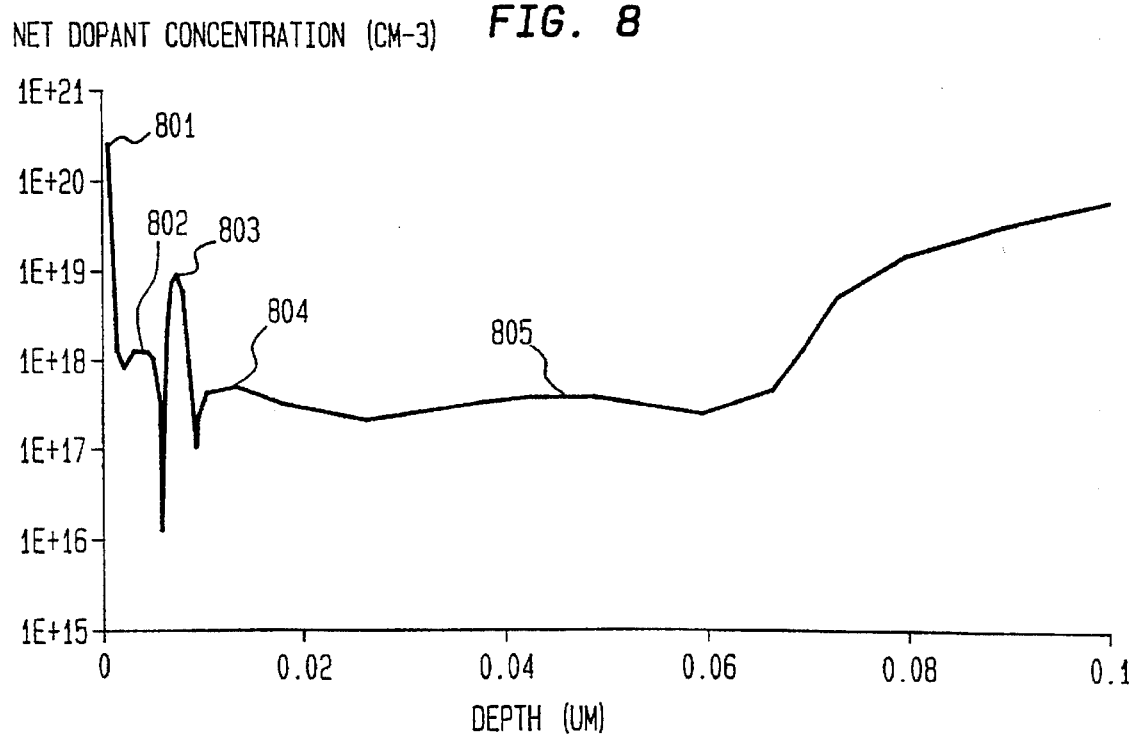
Figure 9:
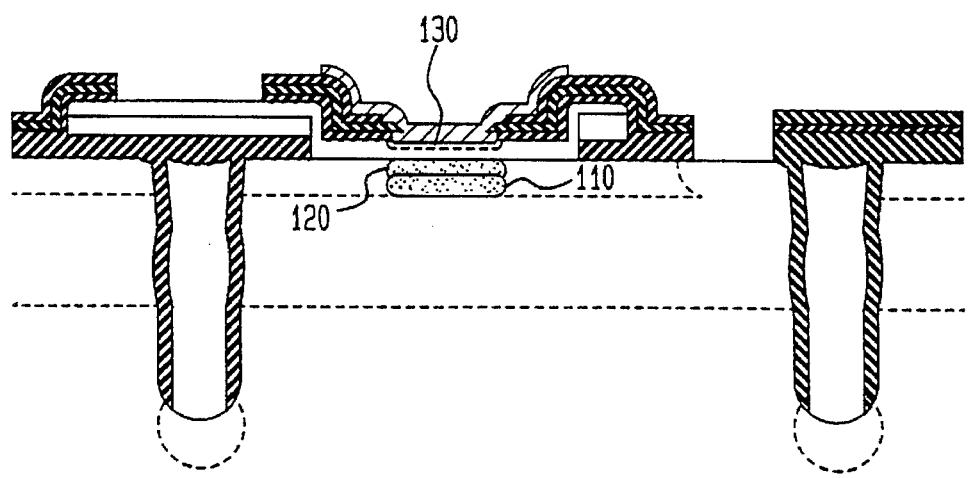
FIG. 9 illustrates, in cross-section, a preferred embodiment of a transistor in accordance with the invention and reflecting a preferred fabrication method.
Figure 10:
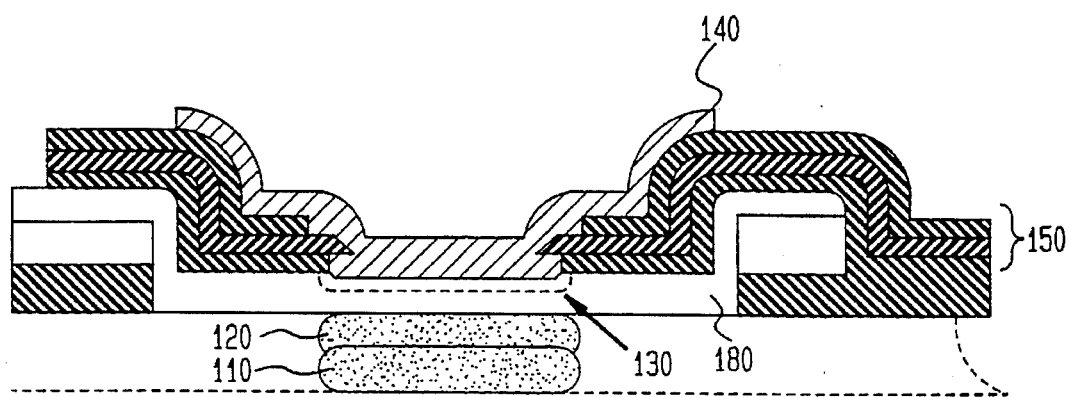
FIG. 10 is an enlarged portion of FIG. 9.

During the first 10 nm of this growth, as shown in FIG. 7, the germanium (Ge) mole fraction (i.e. atomic percent) is ramped up linearly to 30% in the grown material. Over the next 10 nm, the Ge mole fraction is ramped down to 15% while the grown material is doped with boron to a level of approximately $2 \times 10^{19}$/cm$^3$. The base layer is completed to a total thickness of 30 nm which is undoped while the Ge content is further ramped down to 0% of the grown material. This alteration of concentration of band gap determining material, in this case, germanium, during a particular phase of the formation of layer 180, establishes the location and shape of the concentration profile of the band gap determining material within the layer.

The emitter is grown for an additional 60 nm (for a total thickness of 90 nm for the total thickness of layer 180 including both the emitter and base) without doping or alloying.

After formation of the sidewalls within the base opening and formation of an emitter opening, two phosphorus implants are performed through the emitter opening to produce average doping levels of approximately $3\times10^{17}/cm^3$ in the collector, as shown at 110 and 120. A further shallow implantation phosphorus implantation to a concentration of $1\times10^{18}/cm^3$ is made in the emitter, as shown at 130 of FIGS. 9 and 10 to form the retrograde emitter structure.

After formation of an insulator 150, preferably as a three-layer oxide-nitride-oxide (ONO) structure, a polysilicon emitter contact 140 is deposited and heavily doped with arsenic by implantation. The structure is then subjected to a RTA anneal for 15 seconds at 970° C. to drive in the arsenic in the top 30 nm of the emitter layer and alter the as-deposited doping profile of FIG. 7 to that shown in FIG. 8 in which the arsenic contact peak 801 appears at the left. Plateau 802 is the retrograde emitter. The Boron spike of FIG. 7 has been spread over the entire 30 nm of the SiGe base (i.e. the lower 30 nm of the 90 nm deposit forming both the base and emitter) as shown at peak 803. The germanium profile remains virtually unchanged and coincides with peak 803 (although only dopant material concentrations are reflected in FIG. 8) and provides a near optimal accelerating quasielectric field in the intrinsic base region (at a depth of 0.06–0.09 μm). Minor peaks 804 and 805 in the collector region correspond to the mean depths of the collector implantations 110 and 120.

The preferred ranges of parameters of transistors formed in accordance with the present invention include an emitter contact region width of 30–100 nm and peak emitter dopant level of $10^{20}$–$10^{21}/cm^3$, which are non-critical but affect emitter resistance. The retrograde emitter width is preferably in the range of 30–100 nm and should cover the depletion region, but should be minimized to limit resistance and charge storage. The retrograde emitter doping level represents a trade-off between current carrying capability of the transistor and the electric field which increases capacitance and causes leakage but is preferably in the range of $3\times10^{17}$ to $3\times10^{18}/cm^3$. Likewise, the integrated base doping represents a trade-off between base resistance and transit time but is preferably in the range of $10^{13}$ to $10^{14}/cm^2$ The diffusion of base impurities during annealing which determines base width (i.e. thickness) should preferably be limited to 20–60 nm. The peak mole fraction of alloying material also represents a trade-off between performance and stability, however, a thin base allows a higher mole fraction of alloying material. For a SiGe alloy, the preferred mole fraction of germanium is in the range of 10%–30%. The shape of the alloying material concentration profile must provide for the alloy comprising the heterojunction to be positioned in relation to the base emitter junction (determined by the dopant concentration profile). While various shapes or the alloying material concentration profile (i.e. square functions) a ramp shape as would be provided by triangular and trapezoidal functions is preferred to provide acceleration of electrons.

The above described preferred embodiment of the invention has been shown, by simulation, to have a predicted cut-off frequency of approximately 94 GHz as compared with the maximum cut-off frequency of 75 GHz previously attained. Further optimization of the implant conditions and germanium profile, together with minimization of processing temperatures to limit the width of the intrinsic base region should raise cut-off frequencies well above 100 GHz for transistors formed in accordance with the combined self-aligned implantation, retrograde emitter and heterojunction of the present invention.

It should also be noted for an appreciation of the full scope of the invention, that the definition of a heterojunction bipolar transistor requires that the emitter have a larger bandgap than the base in order to achieve enhanced electron injection with respect to hole injection (or vice-versa for a PNP transistor). Within this constraint, many variations of transistor structure are possible including such practical materials as germanium, silicon, silicon carbide, gallium arsenide, aluminum arsenide, indium phosphide and many other compound semiconductors which can, in principle, be grown in successive layers, one upon another, or alloyed together. Bandgap variation can also be extended into the collector to obtain certain fabrication advantages or electrical properties. Among these possible variations, two classes of structures are particularly contemplated as being advantageous for practice of the invention. Specifically, a first class includes an emitter formed of a wide bandgap material over a narrow bandgap material comprising the base/collector/substrate. AlGaAs on GaAs and SiC on Si would be examples of this group in which the wide bandgap emitter material differs from that of the underlying base, collector and substrate (which are, in turn, differentiated by differing dopant concentration levels). A second class includes transistors in which a narrow bandgap material base layer (or other structure) is formed on a collector of wider bandgap material. The emitter material can then be the same material as the collector or a different material having a wider bandgap than the base. The above described preferred SiGe in silicon embodiment is an example of this second class of transistors to which the invention may be advantageously applied. Therefore, to fully generalize the invention, within the above constraint regarding the bandgaps of the base and emitter materials, the bandgaps of the transistor elements should be considered as variable throughout the device and the crystal grown in multiple steps, possibly including the use of continuous alloy grading.

Further, the present invention should be considered as including the combination of a heterojunction bipolar transistor with the emitter doping being significantly less than the base doping, enabled by the gain developed from the bandgap variation provided by the heterojunction, and the emitter and, possibly collector doping supplied through the emitter contact opening to allow further reduction of the background emitter doping to allow flexibility in design of the electrical field near the base contacts. In general, the emitter doping may be placed in a region the bandgap of which differs from that of the substrate or collector. Because the base doping is significantly greater, the emitter doping has a significant effect only outside of the base, as determined by doping. As the crystal structure is annealed or otherwise thermally treated, only the dopants are diffused while the concentrations of alloying material remain substantially fixed in location. Therefore, the base impurity concentration profile, as deposited, should be designed with the final desired base impurity profile in mind in relation to the profile of the bandgap determining material. The emitter doping does not significantly affect the base.

While the invention has been described in terms of a single preferred embodiment, those skilled in the art will recognize that the invention can be practiced with modification within the spirit and scope of the appended claims.

Having thus described my invention, what we claim as new and desire to secure by Letters Patent is as follows:

1. A method of making a transistor structure including an emitter-base heterojunction and a retrograde emitter including the steps of depositing a layer over a collector region, said layer including an emitter-base heterojunction having a concentration profile of at least one band gap determining alloying material, said step of depositing a layer including the step of depositing impurities in said layer in accordance with an impurity concentration profile, forming an emitter opening in an insulator over said layer including said emitter-base heterojunction, and forming an emitter of said transistor structure by impurity implantation in said layer including said emitter-base heterojunction self-aligned with said emitter opening.

2. A method as recited in claim 1, including the further step of forming a gradually varying alloy composition effective to produce an accelerating quasi-electric field.

3. A method as recited in claim 1, wherein said depositing impurities step includes the further step of forming a collector region by impurity implantation self-aligned with said emitter opening.

4. A method recited in claim 1, wherein said layer including said emitter-base heterojunction is composed primarily of silicon and said alloying material is germanium.

5. A method recited in claim 1, wherein said process includes the further steps of forming a deposit of heavily doped polysilicon to said layer including said emitter-base heterojunction, and diffusing impurities from said heavily doped polysilicon into said layer including said emitter-base heterojunction.

6. A method as recited in claim 1, including the further steps of implanting impurities to a shallow depth in said layer including said emitter-base heterojunction and depositing a layer of metal to form an emitter contact.

7. A method as recited in claim 2, including the further steps of forming a deposit of heavily doped polysilicon to said layer including said emitter-base heterojunction to form an emitter contact.

8. A method as recited in claim 7, wherein said layer including said emitter base heterojunction is composed primarily of silicon and said band gap determining material is germanium.

* * * * *